United States Patent
Ammar

(10) Patent No.: US 11,071,198 B2
(45) Date of Patent: Jul. 20, 2021

(54) HIGHLY INTEGRATED MINIATURE RADIOMETER CHIP

(71) Applicant: Vu Systems, LLC, Morrisville, NC (US)

(72) Inventor: Danny Ammar, Orlando, FL (US)

(73) Assignee: Vu Systems, LLC, Morrisville, NC (US)

( * ) Notice: Subject to any disclaimer, the term of this patent is extended or adjusted under 35 U.S.C. 154(b) by 241 days.

(21) Appl. No.: 16/395,848

(22) Filed: Apr. 26, 2019

(65) Prior Publication Data

US 2019/0364658 A1     Nov. 28, 2019

Related U.S. Application Data

(60) Provisional application No. 62/677,035, filed on May 27, 2018.

(51) Int. Cl.

| | |
|---|---|
| H05K 1/02 | (2006.01) |
| H05K 1/14 | (2006.01) |
| H05K 5/06 | (2006.01) |
| H05K 5/03 | (2006.01) |
| H01P 5/08 | (2006.01) |
| G01K 11/00 | (2006.01) |

(Continued)

(52) U.S. Cl.
CPC ......... *H05K 1/0243* (2013.01); *G01K 11/006* (2013.01); *H01P 5/08* (2013.01); *H05K 1/025* (2013.01); *H05K 1/111* (2013.01); *H05K 1/144* (2013.01); *H05K 5/03* (2013.01); *H05K 5/069* (2013.01); *H05K 1/181* (2013.01); *H05K 2201/042* (2013.01); *H05K 2201/09036* (2013.01); *H05K 2201/10151* (2013.01); *H05K 2201/10159* (2013.01); *H05K 2201/10174* (2013.01); *H05K 2201/10545* (2013.01)

(58) Field of Classification Search
CPC .................................................... G01K 11/006
USPC ......................................................... 250/394
See application file for complete search history.

(56) References Cited

U.S. PATENT DOCUMENTS

| | | |
|---|---|---|
| 6,100,841 A | 8/2000 | Toth et al. |
| 7,135,848 B1 | 11/2006 | Ammar |
| 2004/0203337 A1 | 10/2004 | Ammar |

(Continued)

OTHER PUBLICATIONS

International Search Report and Written Opinion of the International Searching Authority, International Application No. PCT/US19/30163, dated Jul. 22, 2019, 10 pp.

*Primary Examiner* — David P Porta
*Assistant Examiner* — Abra S Fein
(74) *Attorney, Agent, or Firm* — Myers Bigel, P.A.

(57) ABSTRACT

A highly integrated miniature radiometer chip includes a base board with opposing top and bottom etched metal layers to form interconnect and ground pads, and a cavity to provide space for surface mounted parts that are attached to the bottom of a middle board which mounts directly over the top of the base board. The middle board has radio frequency circuits and semiconductor chips at a top metal layer, and surface mounted parts, and ground and signal pads at a bottom metal layer. Metalized vias extending through the dielectric material connect the top and bottom layers. A top cover includes a feedhorn, a waveguide section, and isolation compartments and channels that overlie the RF circuits on the middle board. A dielectric insert is located inside the feedhorn to enhance the feedhorn performance and seal the radiometer chip from external air, humidity and contaminants.

20 Claims, 14 Drawing Sheets

(51) Int. Cl.
*H05K 1/11* (2006.01)
*H05K 1/18* (2006.01)

(56) References Cited

U.S. PATENT DOCUMENTS

| | | |
|---|---|---|
| 2005/0122254 A1 | 6/2005 | Ammar |
| 2010/0079348 A1 | 4/2010 | Dietmeier |
| 2011/0051375 A1 | 3/2011 | Ammar |
| 2015/0162668 A1 | 6/2015 | Oppenlaender et al. |

HIGHLY INTEGRATED MINIATURE RADIOMETER CHIP

RELATED APPLICATION

This application claims the benefit of and priority to U.S. Provisional Patent Application No. 62/677,035 filed May 27, 2018, the disclosure of which is incorporated herein by reference as if set forth in its entirety.

FIELD OF THE INVENTION

The present invention relates generally to radiometers.

BACKGROUND OF THE INVENTION

Since high frequency radio waves are similar to long wave infrared radiation, a hot body would be expected to radiate microwave energy thermally. To be a good radiator of microwave energy, a body typically must be a good absorber. A good thermal radiator is a "black body." The amount of radiation emitted in the millimeter wave (MMW) range is about 108 times smaller than the amount emitted in the infrared range. Current MMW receivers, however, have at least 105 times better noise amplification than infrared detectors, and with some temperature contrast, the remaining 103 may be recovered. This makes passive MMW imaging comparable in performance with current infrared systems. However, MMW provides much better performance in fog and rain. This unique characteristic makes passive millimeter wave (PMMW) radiometers a popular choice for Enhanced Vision Systems (EVS) used for aircraft landing in fog. MMW radiometers have also been used in other applications, for example, remote terrestrial and extraterrestrial sensing, medical diagnostics and defense applications. The lowest loss MMW electromagnetic radiation windows occur at 35 GHz, 94 GHz, 140 GHz and 220 GHz. The choice of frequency depends on specific applications.

Focal plane arrays are used to form images from the radiation received by a reflector antenna or lens. MMW focal plane array radiometers also have been used in many applications to form images based on thermal sensing of radiated microwave energy. The sensitivity of existing radiometer designs, however, has been limited to about 1 degree K, resulting in poor images.

The operating principles of radiometers are well known to those skilled in the art of the present invention. Natural radio emission from microwave background, discrete sources, the Earth's atmosphere, and the ground is random noise that is nearly indistinguishable from the noise generated by a warm resistor or by receiver electronics. Noise voltage has zero mean and varies randomly on the very short time scales (nanoseconds) comparable with the inverse bandwidth of the receiver. A square-law detector in the radiometer squares the input noise voltage to produce an output voltage proportional to the input noise power. Noise power is always greater than zero and usually steady when averaged over times. By averaging a large number N of independent noise samples, an ideal radiometer can determine the average noise power with a small uncertainty and detect a faint source that increases the antenna temperature by a tiny fraction of the total noise power. The ideal radiometer equation expresses this result in terms of the receiver bandwidth and the averaging time.

The sensitivity of radiometer measurements are also often limited by random gain fluctuations in the RF front end, low frequency noise (1/f), and bias in the detector circuits. Many of the current designs have not yielded a solution that allows MMW radiometers to be commercially viable. In addition, the high cost of MMW RF receivers has limited the number of channels in the radiometer, resulting in a requirement to scan in azimuth, elevation or both to create an image.

Recent advances in radiometer sensitivity are enabling the use of these devices in many applications, such as concealed weapon detection, passive imaging, and medical diagnostics. The cost of MMW radiometer sensors, however, is still relatively high due to manufacturing challenges. In most applications, the sensor is only made up of very few receivers. Images are typically created by scanning an antenna sub reflector in one or two dimensions to create a multi-pixel image. Although this technique is widely used, the image frame rate is limited by the mechanical scan rate.

In addition to their high cost, current radiometers typically suffer from large size due to physical restrictions imposed by their feedhorns, and the size of the electronic circuits. The size of the feedhorn is dictated by the wavelength of the RF signal, which is orders of magnitude larger than that of infrared or optical signals.

Radiometer modules have been designed and built for decades. The most common method used by manufacturers of radiometer modules, is to assemble the chips and RF components in a machined metal housing with expensive waveguide interfaces. A Typical radiometer module consists of a number of Microwave Monolithic Integrated Circuit (MMIC) chips, substrates with matched impedance lines and filters, and passive components, all mounted with epoxy or solder to a machined housing. The chips and substrates components are typically connected to other each other via wire or ribbon bonds. Tuning of the radiometer modules after assembly is almost always necessary.

High frequency radiometer modules typically require special RF board material or substrate with stable dielectric characteristics and tight manufacturing tolerances because of the inherent shorter wavelength. They also may require intricate housing enclosures with channelization for wave propagation and isolated compartments to avoid interference and prevent oscillations. These housings are typically made of expensive coefficient of thermal expansion (CTE) matched material to prevent damage to the semi-conductor chips during temperature cycles.

One of the challenges in using multiple radiometer modules, for example for imaging, is that each module may have a different output, different sensitivity, and different behavior over temperature. Conventional radiometers may require extensive calibration and harmonization of the pixels in order to be able to generate good images.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

One aspect of this invention is predicated on the concept of providing a simple, highly integrated miniature radiometer module referred to as a "radiometer chip" comprising multiple chips and RF circuits arranged in a highly compartmentalized, easily assembled, and lower in cost SMT package. In one embodiment, the miniature radiometer chip includes a base board formed from a dielectric material and opposing top and bottom metal layers and arrays of metal plated vias extending through the laminate material and connecting the two metal layers. The dielectric material is FR-4. FR-4, which is an abbreviation for Flame Retardant 4, is a laminate consisting of a continuous filament glass cloth material with an epoxy resin binder. Although different types of PCB materials may be used, FR-4 is preferred due to several mechanical and electrical properties; including high insulation, high physical strength and stiffness, low weight, low moisture absorbance, flame resistance, low cost, and worldwide availability. The bottom layer has ground, signal, and heat transfer pads for surface mounting the module on a printed circuit board (PCB) and transferring the heat from the module to the PCB. The top layer has ground, signal, and heat transfer pads to transfer signals to a middle board and provide heat flow path. It also has machined cavity to provide space for the surface mounted chips that are mounted in the bottom of the middle board. The multi-layer middle board top surface has radio frequency (RF) transmission lines, SMT chips, and MMIC's, and a micro-strip to waveguide transition. The bottom layer has surface mount parts and provides connections to the base board. Semiconductor chips and MMIC's are mounted to the top and bottom of the middle board using epoxy or solder and are operative with the RF etched circuits and signal pads for receiving external DC and control signals. A top cover made of injection molded electrically conductive plastic materials, such as PRE-ELEC®, or made of other non-conductive plastics, which is then metal plated. The cover has a built in waveguide section that interfaces with the micro-trip to waveguide transition on the top surface of the middle board, and a feedhorn that is filled with dielectric material for capturing RF energy. The dielectric material enhances the feedhorn performance and allows the radiometer chip to be completed sealed from external air and moisture. It also facilitates pick and placing of the radiometer chip on a SMT board.

In an alternate aspect of the present invention, the multi-layer middle board can be formed of FR4 core and soft dielectric material such as PTFE with opposing copper clad layers. Heat transfer vias and interconnect vias could be formed within the middle board. The metal plated vias extend through the middle board and connect the top and bottom ground layers. Other metal plated vias can extend from a top metal layer to bottom signal pads for carrying input and output signals to the base board. A bottom metal layer of the middle board can be configured for mounting on the base board using epoxy or solder.

In yet another aspect of the present invention, the top cover is made of injection molded plastic material to form the feedhorn, waveguide section, and channels and compartments to provide isolation between RF circuits and chips. Metal plating can be used to enhance the electric conductivity of the plastic surface.

In accordance with another aspect, the middle board has a microstrip-to-waveguide transition operatively connected between the feedhorn and the MMIC and receiving RF signals from the feedhorn and passing the RF signals into the MMIC low noise amplifier. This micro-strip-to-waveguide transition can include a backshort and a launch probe operatively connected to the MMIC for passing RF signals to the MMIC.

In yet another aspect, the detector circuit can be formed as a diode operatively connected to a capacitor for forming a detected output. The MMIC LNA could be made into a variable gain amplifier by controlling the gate bias to the amplifier. DC signal vias can extend from the at least one MMIC through the middle board.

In another aspect, the video amplifier, which amplifies the detected signal can have variable gain and can be used to adjust the radiometer module gain and output voltage. This feature enables equalization of the radiometer chip outputs in multi-pixel applications.

In another aspect, the miniature radiometer module includes a erasable programmable read-only memory EPROM for storing module characterization and calibration data. These unique features are extremely important for equalizing the module output when using multiple radiometer modules in a FPA configuration In yet another aspect, a plurality of radiometer sensor modules can be surface mounted on a printed circuit board to form a Focal Plane Array (FPA). By selectively rotating individual radiometer sensor cells, the selection of polarization can be accomplished.

According to some embodiments of the present invention, a radiometer chip includes a base board, a middle board attached to the base board, and a cover attached to the middle board, such that the middle board is sandwiched between the base board and the cover. The base board has opposing first and second surfaces, each surface comprising ground and signal pads, and a cavity formed in the second surface. The middle board has opposing first and second surfaces, and the middle board first surface is attached to the base board second surface, for example, via adhesive or solder, and such that ground and signal pads on the middle board first surface are electrically connected to the ground and signal pads respectively of the base board second surface.

The middle board first surface comprises one or more electrical components that extend into the base board cavity, and the middle board second surface comprises etched radio frequency (RF) circuits, a waveguide-to-microstrip transition, at least one low noise amplifier (LNA), a detector diode, a video amplifier, and a temperature sensor. The LNA is operatively connected to the waveguide-to-microstrip transition and a detector circuit for producing a detected signal and for further amplification by a video amplifier. An output of the detector diode is connected to a variable gain video amplifier. The temperature sensor is configured to sense a temperature of the radiometer chip. The one or more electrical components on the middle board first surface provide DC signal conditioning, gate biasing of the LNA, gain control of the video amplifier, digital interfaces, and memory storage of data for the radiometer chip. The memory storage stores radiometer chip calibration data comprising output voltage versus temperature, sensitivity slope, and serial number.

The cover is attached to the middle board second surface, for example, via adhesive or solder, and includes a feed horn that is connected to the waveguide-to-microstrip transition. The cover includes a waveguide section, and compartments for isolating the RF circuits of the middle board. The feed horn includes an insert of dielectric material that is configured to improve feedhorn performance and seal the radiometer chip from outside air, humidity and contaminants.

In some embodiments, the base board and middle board comprise FR4 material, and the cover comprises metalized injection molded plastic.

In some embodiments, the middle board comprises multiple layers of laminated high frequency soft boards.

Embodiments of the present invention advantageously overcome the prior art drawbacks and provides an SMT miniature radiometer chip by using a low cost materials to create a chip size miniature radiometer module that is surface mounted on an external circuit board or carrier of the type known to those skilled in the art.

The miniature radiometer module of the current invention is highly integrated, uses no metal housings, has a small foot print (e.g., 6 mm×6 mm×6 mm), provides high level of isolation between the different circuits, and costs a fraction of prior art radiometer modules. The miniature radiometer module, which can also be referred to as a "radiometer chip", comprises a base board for surface mounting the module to a Printed Circuit (PCB) board, a middle board with a number of semiconductor chips and MMIC's, and a cover made of injected molded plastic and includes a feedhorn, which is filled with dielectric material. The base board provides three main functions: 1) interface for easy mounting of the miniature radiometer module using surface mount technology (SMT), 2) transfer signals to the middle boards, 3) transfer heat from module to the PCB board the module will be mounted on. The middle board provides two main functions: 1) acts as a carrier for the chips and the MMIC's, 2) provides all the necessary matched impedance transmission lines (etched on it) and the microstrip-to-waveguide transition. The semiconductor chips used in the radiometer chip can be SMT type (packaged dies) or MMIC bare dies. The cover with its built in feedhorn is made of injection molded electrically conductive plastic material, such as PRE-ELEC® material sold by Premix, or regular plastic which is then metal platted to create conductive surfaces.

Radiometer modules according to embodiments of the present invention may be utilized in, for example, in sensors, and Passive Millimeter Wave (PMMW) imaging systems.

It is noted that aspects of the invention described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail below.

BRIEF DESCRIPTION OF THE DRAWINGS

The accompanying drawings, which form a part of the specification, illustrate various embodiments of the present invention. The drawings and description together serve to fully explain embodiments of the present invention.

DETAILED DESCRIPTION

Figure 1:
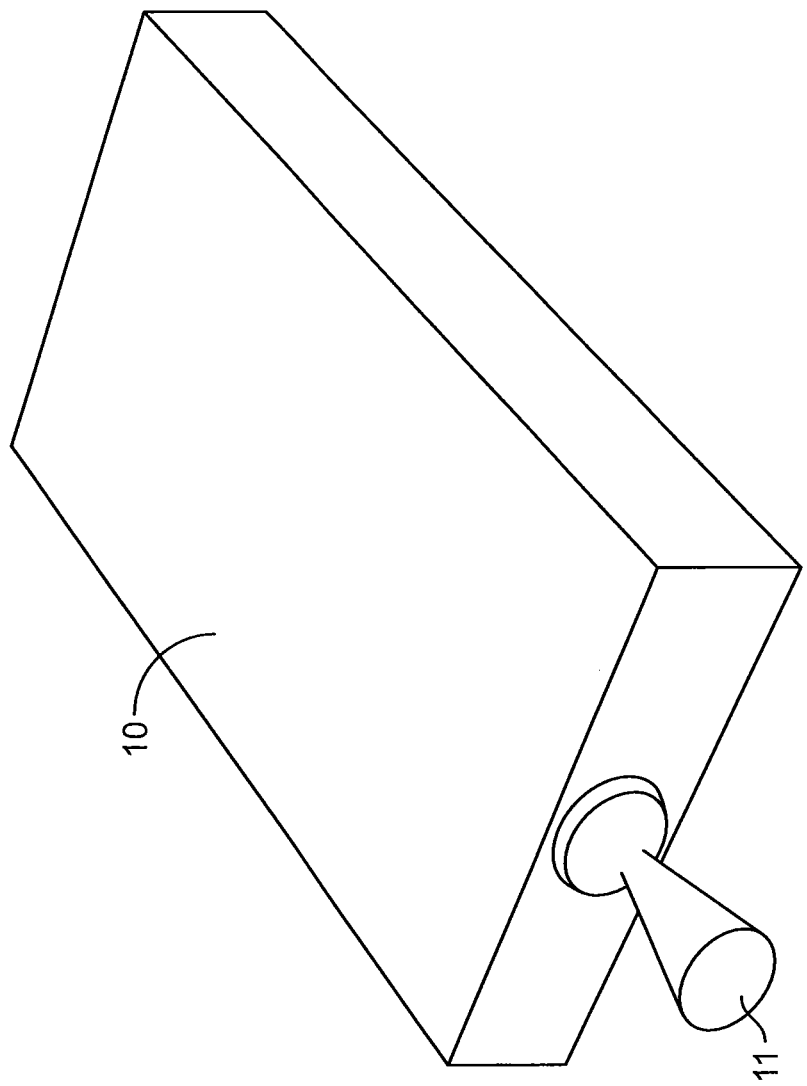
FIG. 1 is a perspective view of a conventional single channel radiometer and feedhorn.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. Features described with respect to one figure or embodiment can be associated with another embodiment or figure although not specifically described or shown as such.

It will be understood that when a feature or element is referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "secured", "connected", "attached" or "coupled" to another feature or element, it can be directly secured, directly connected, attached or coupled to the other feature or element or intervening features or elements may be present. In contrast, when a feature or element is referred to as being, for example, "directly secured", "directly connected", "directly attached" or "directly coupled" to another feature or element, there are no intervening features or elements present. The phrase "in communication with" refers to direct and indirect communication. Although described or shown with respect to one embodiment, the features and elements so described or shown can apply to other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

As used herein, the term "and/or" includes any and all combinations of one or more of the associated listed items and may be abbreviated as "/".

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that although the terms first and second are used herein to describe various features or elements, these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "about", as used herein with respect to a value or number, means that the value or number can vary by +/−twenty percent (20%).

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Current radiometer sensors are high in cost and have an overly large size imposed by physical limitations, which have prevented adequate commercialization of such sensors. In accordance with a non-limiting example of the present invention, low cost radiometer sensor modules as integrated packages can now be produced in high volume and overcome the physical restrictions by relying on a miniature package as an integral radiometer sensor that permits RF energy sensing and detection, gain control, temperature sensing, and calibration data storage. The radiometer sensor integrated module as a package is also referred to herein as a "radiometer chip" because of its characteristics of sensing and detecting RF energy, self-calibrating, and storing characterization data in its memory. The radiometer chip, in accordance with one non-limiting example of the present invention, is self-contained and encompasses an RF feed, signal amplification, RF signal detection, video amplification, gain setting, temperature sensing, and calibration data storage. Because the radiometer chip encompasses all these functions and is packaged as a small surface mounted chip or package it can be mounted directly to a substrate, for example, an FR4 board or similar radiometer sensor support or printed wiring board, thereby eliminating the requirement for an expensive housing.

Radiometer chips in accordance with embodiments of the present invention are easy to manufacture with existing manufacturing techniques and provide a high degree of flexibility in creating one or two-dimensional arrays of radiometer sensors. A self-contained, individual radiometer chip converts RF energy into a detected video signal, analogous to using optical diodes to sense light intensity and converting it to a current or voltage signal. All connections to the radiometer chip can be typically at DC or low frequency levels and therefore, normal surface mount technology (SMT) can be used for the overall radiometer device assembly.

In accordance with another non-limiting example of the present invention, size issues for radiometer modules are also overcome by implementing a vertical layering technique, and thus achieving a smaller size radiometer chip and allowing closer spacing of any radiometer sensor cell channels.

In accordance with a non-limiting example of the present invention, a radiometer device as an imaging system can be made from a plurality of individual radiometer chips, and include self-contained surface mount technology radiometer chips that convert RF energy to a detected output voltage. Each radiometer chip can include a feedhorn to reduce size and allow tighter pixel-to-pixel spacing. The radiometer chip encompasses the radio frequency (RF) functions into a single chip, including RF energy capture, low noise amplifier (LNA) functions, power detection, and video amplification. The radiometer chip, in accordance with another non-limiting example of the present invention, substantially eliminates the requirement for a bandpass filter and the MMIC low noise amplifiers (LNA's) can be designed with an appropriate bandwidth to allow flexible designs of multi-channel radiometer sensor circuits. This type of design also can eliminate the requirement for an expensive housing and RF feedhorns. This design can also support both horizontal and vertical polarizations that can be set by the orientation of the radiometer chip surface mounted on a support board such as a printed wiring board.

FIG. 1 is a perspective view of a conventional single channel radiometer 10 having an air filled feedhorn antenna 11, which captures the RF energy emitted from a target. The feedhorn 11 is typically placed in an antenna or lens focal point as is known to those skilled in the art. Radiometer images are created by scanning a sub reflector that points the antenna beam in different directions.

Figure 2:
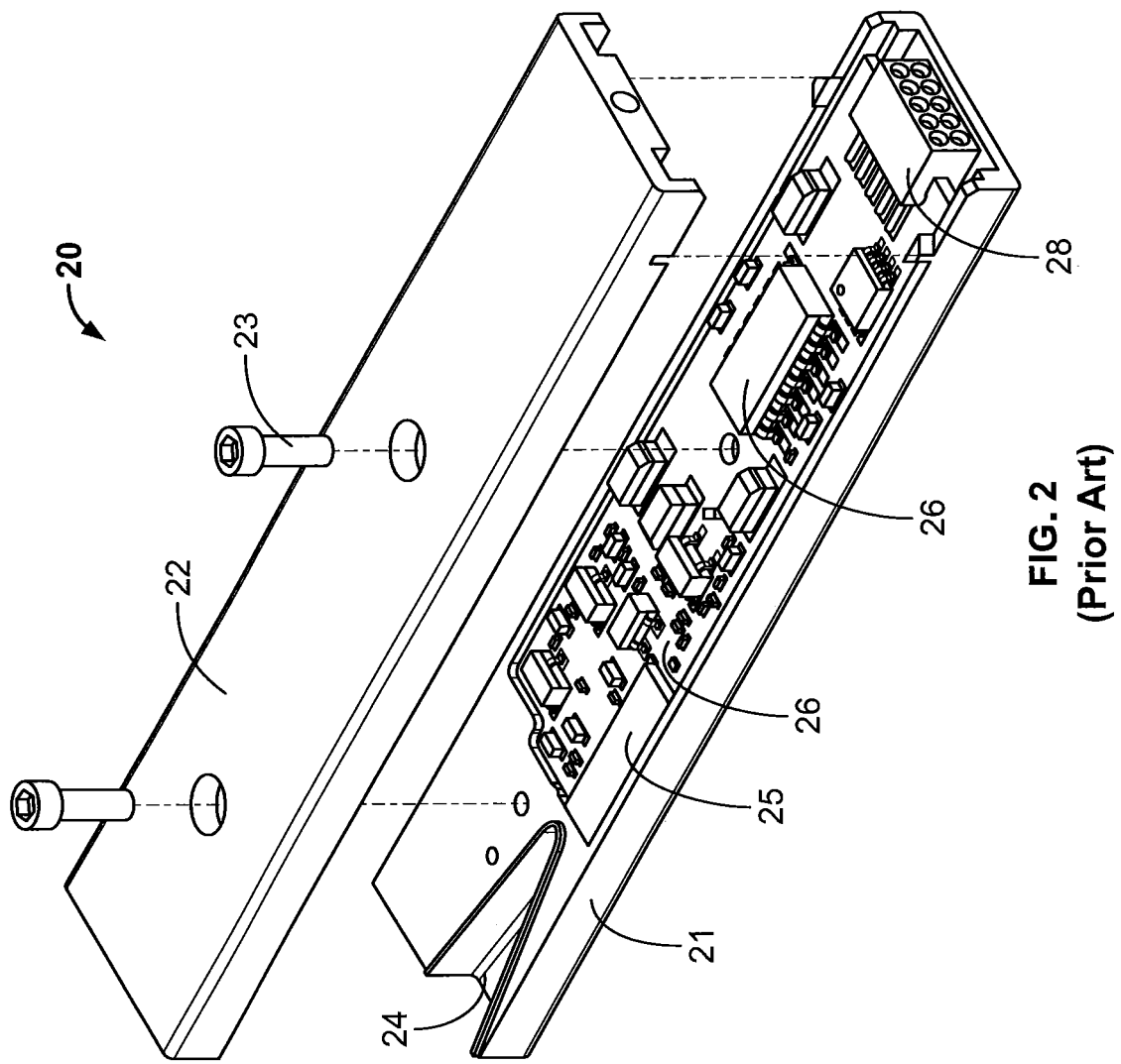
FIG. 2 is a perspective view of a conventional integrated radiometer module with built in feedhorn and metal housing, and with the cover removed for clarity.

FIG. 2 is a perspective view of a conventional single channel radiometer module 20 having a base metal housing 21 and a metal housing cover 22 attached to each other using fasteners 23. The module housing 21 includes a machined feedhorn 24 that receives RF energy, amplifies it and detects it in an RF section 25. A board assembly 26 is used to house all the surface mount parts 27 used for signal conditioning and interface. A connector 28 is used to interface the radiometer module 20 to a board. A typical size for this radiometer module is about (6 mm×12 mm×50 mm).

As known to those skilled in the art, there are different types of RF feedhorns. The most popular are a circular feedhorn and a rectangular feedhorn. The beam width generated by a rectangular feedhorn is typically proportional to the size of the horn.

$$\theta = k\lambda/X$$

where $\theta$ is a 3 dB beam-width, k is a constant from 56 to 70 (dependent on shape and efficiency), $\lambda$ is the wavelength, and X is the horn dimension (width or height).

To achieve reasonably small beam-width, these types of feedhorns are relatively large, making it difficult to create one or two-dimensional sensor arrays for radiometers. The spacing between the feedhorns required to create good images in radiometer applications is typically less than a single wavelength. Also, the beam-width created by each feedhorn should be small enough to match the antenna lens size. For example, at 90 GHz, an optimum feedhorn spacing is less than or equal to about 0.133 inches. This spacing could result in a small horn size and consequently wide unusable beam width. In most applications, a trade-off is required between the beam-width and any feedhorn spacing.

Figure 3:
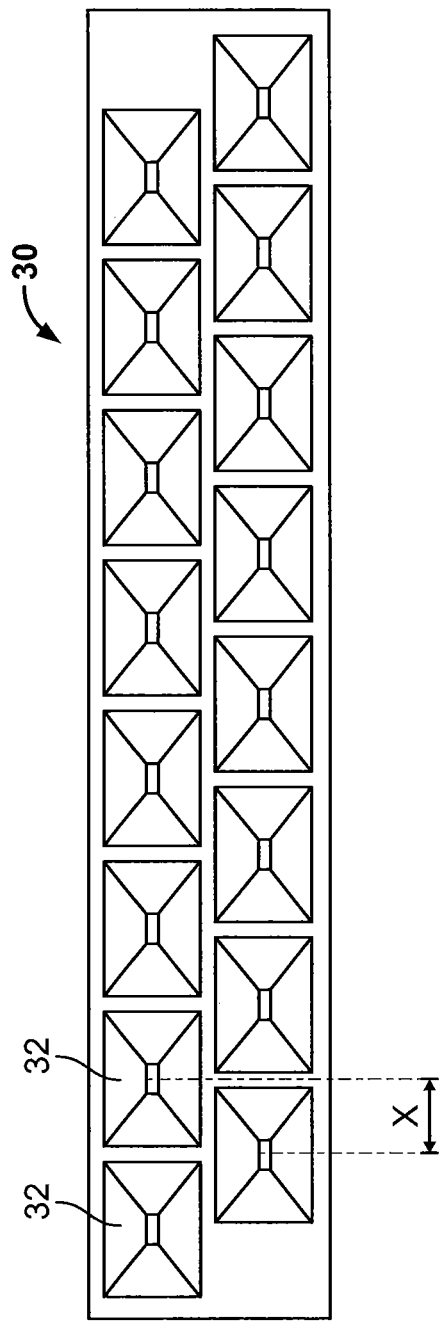
FIG. 3 is a top plan view of a staggered two-dimensional array of radiometer modules typically used in some types of radiometers.

Many techniques have been used to overcome the spacing/beam-width restrictions. An example of one technique is shown in the example of the feedhorn array 30 of FIG. 3, where the individual feedhorns 32 are staggered and offset to create a closer spacing between the pixels. With this technique, however, to achieve reasonable beam widths of about 30 degrees, the spacing between the center line of the feedhorns, indicated by "X", typically exceeds one wavelength at 90 GHz.

Figure 4:
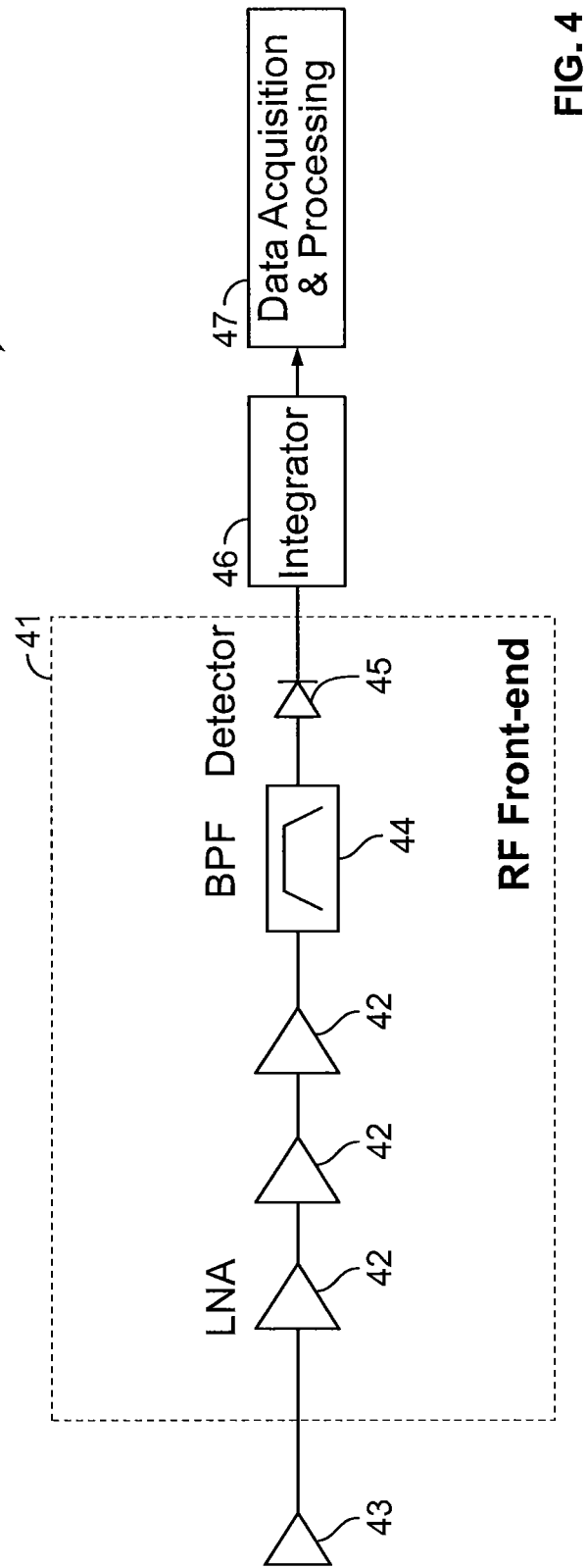
FIG. 4 is a block diagram showing various electrical components for a radiometer.

FIG. 4 is a schematic block diagram showing high level components used in a single channel total power radiometer module, illustrated generally at 40. As illustrated, the radiometer 40 includes a RF front-end as indicated by the dashed lines at 41 and includes a series of low noise amplifiers (LNA's) 42 which receive RF energy from a feedhorn 43, amplifies it, and passes it into a bandpass filter 44. The filtered signal is detected within a detector 45 and integrated within an integrator circuit 46. The integrated signal passes into a data acquisition and processing circuit 47.

The feedhorn 43 senses target temperature, which is proportional to the radiated target energy. The energy passes through the feedhorn into a series of low noise amplifiers (LNA) 42, formed as MMIC chips in some examples. A bandpass filter 44 sets the receiver bandwidth. The detector 45 is typically designed as a square law detector for detecting the signal, passing it to the integrator 46, which sums the signal over an observation period. The integrated signal is digitized, compensated for gain variation, and processed for video display within the data acquisition and processing circuit 47. Gain variations in the receiver present great challenges to forming stable images.

Figure 5:
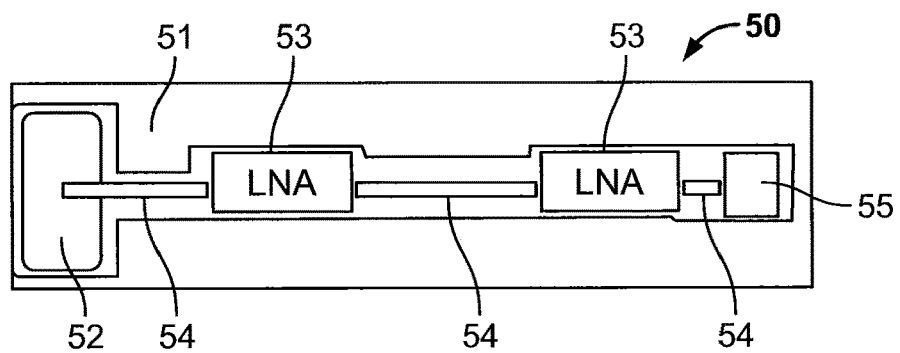
FIG. 5 illustrates electrical components for a radio frequency (RF) section of a radiometer.

FIG. 5 is a top plan view of a typical component layout for a radiometer high frequency front-end system 50, for example, as shown in FIG. 4. Various components as illustrated can be contained on a machined housing 51 formed from metal. A microstrip-to-waveguide transition 52 connects to a series of LNA's 53, typically formed as MMIC chips, using microstrip lines 54. The last series connected LNA is connected to a detector diode 55. Any feedhorn such as the type discussed above is usually connected to the RF front end at the microstrip-to-waveguide transition 52.

The MMIC chips are typically mounted, using for example epoxy or eutectic solder, inside a narrow machined channel in the metal housing 51. The MMIC chips are typically connected to the microstrip line with the ribbon bonds (not shown). A metal cover (not shown) is typically used to seal the overall RF section.

As discussed above, current radiometer sensors typically have high cost and physical restrictions, preventing commercialization of the sensors. Radiometer sensors, in accordance with non-limiting examples of the present invention, however, can be manufactured in volume and overcome many of the physical restrictions of prior art sensors. In accordance with one non-limiting example of the present invention, the radiometer chip of the current invention incorporates a packaging technique that allows RF energy sensing amplification, detection and calibration in a miniature package, similar to a light sensing diode, except it senses RF energy instead of light. The miniature radiometer module could be termed "radiometer chip" designating a self-contained radiometer sensor cell that encompasses the RF feed, signal amplification, detection and calibration data storage in one integrated package. Because the RF functions and detection are self-contained, these radiometer modules can be packaged in small surface mount chips that mount directly to a substrate board, such as an FR4 board or similar support board or substrate, for example, a printed wiring board.

To minimize the size of the radiometer sensor cells, in accordance with a non-limiting example of the present invention, different manufacturing and assembly techniques can be used effectively. For example, the chip can be designed in vertical layers and large air filled feedhorns and waveguides can be replaced with dielectrically filled feedhorns and waveguides. Use of a dielectric material allows shrinking of the feedhorn and the waveguide size by square-root of ($\xi$), where $\xi$ is the dielectric constant of the fill material.

The number of MMIC chips can be reduced by using higher gain LNA's. The RF filter can be eliminated by designing the LNA's with the proper out-of-board rejection.

The present invention does not use any metal housing or expensive connectors and substrates. It is directed to a low cost, miniature multi-chip module formed as a single Surface Mount Technology (SMT) package, allowing at least a 100:1 reduction in size and weight as compared to prior art radiometer modules that are similar in function. The miniature module of the present invention uses a low cost FR4 and RF soft board as a base carrier for semiconductor chips. The miniature module cover, which is made of injection molded plastic, protects the chips, provides compartments for circuit isolation, creates propagation waveguide channels, and includes the feedhorn. The base board, the middle board and the cover when assembled form a Surface Mount Technology (SMT) miniature radiometer chip that mounts directly to a larger external board or carrier. This miniature SMT chip simplifies manufacturing by incorporating all functions into a single miniature package.

Figures 6A, 6B:
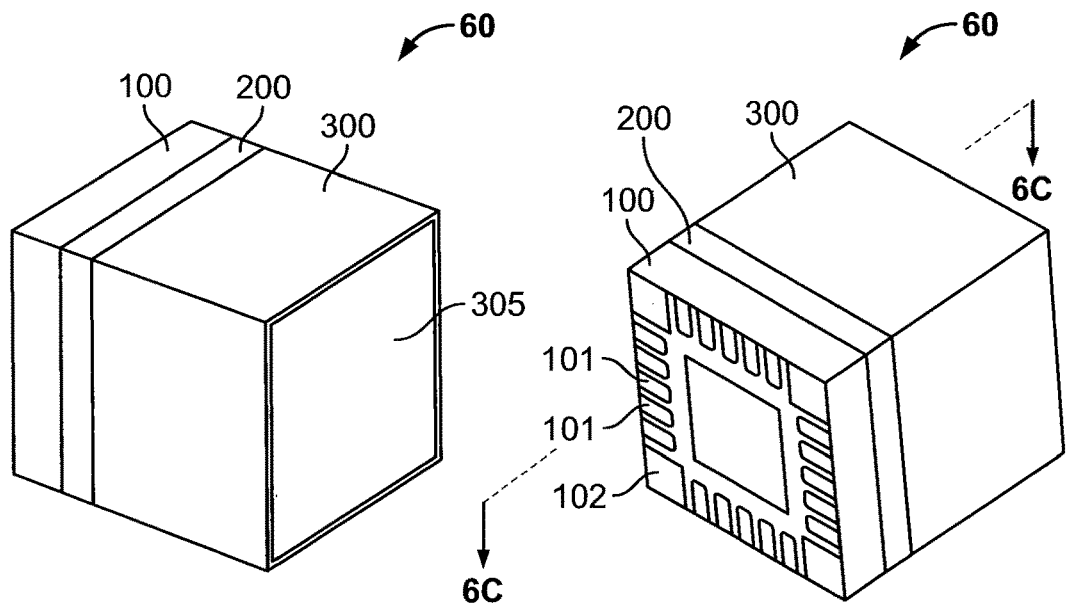
FIG. 6A is a front perspective view of a miniature radiometer module as an integrated package, also referred to as a radiometer chip, in accordance with an embodiment of the present invention.
FIG. 6B is a rear perspective view of the miniature radiometer chip of FIG. 6A.
Figure 6C:
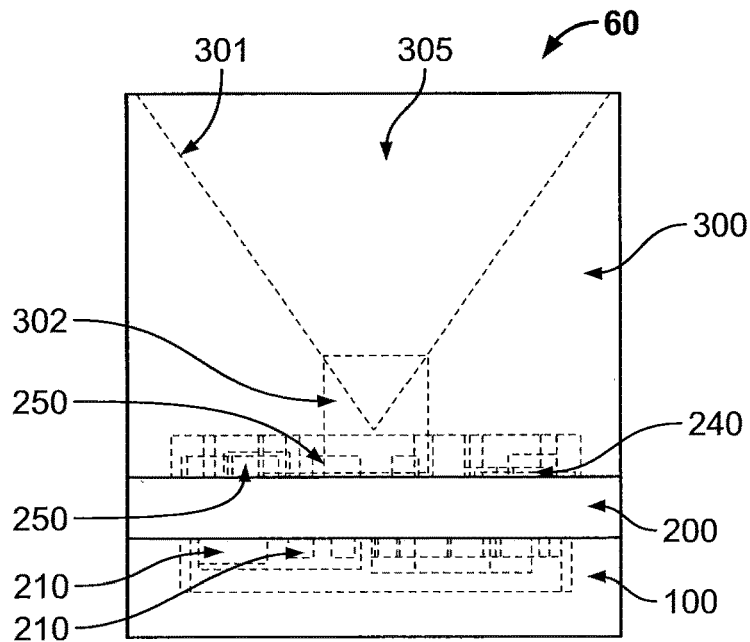
FIG. 6C is a cross-sectional view of the radiometer chip of FIG. 6A taken along lines 6C-6C.

FIGS. 6A and 6B are front and back perspective views of a radiometer sensor cell ("radiometer chip"), in accordance with one non-limiting example of the present invention, and illustrated at 60. The length, width, and height can be about 6 mm, in one non-limiting example, including a dielectrically filled feedhorn 301 (FIG. 6C). The base 100 of the radiometer sensor cell 60 can be produced from FR4 board material. The middle board 200 is a multilayer board made of FR4 core with soft board RF substrate material. It is secured to the base board using epoxy of solder. The cover 300, which is made of injection molded plastic with metal plating, encompasses dielectrically filled feed horn 301. The feedhorn 301 can be molded and shaped as part of the cover 300, and can be filled with a highly controlled, dielectric material, for example, a resin or polymer such as polytetrafluoroethylene (PTFE), sold under the trade designation Teflon or similar polymer material. The cover is secured to the top of the middle board using epoxy or solder in one non-limiting example. Of course, there are many other possible shapes and forms that a radiometer chip 60 can take.

Figure 7A:
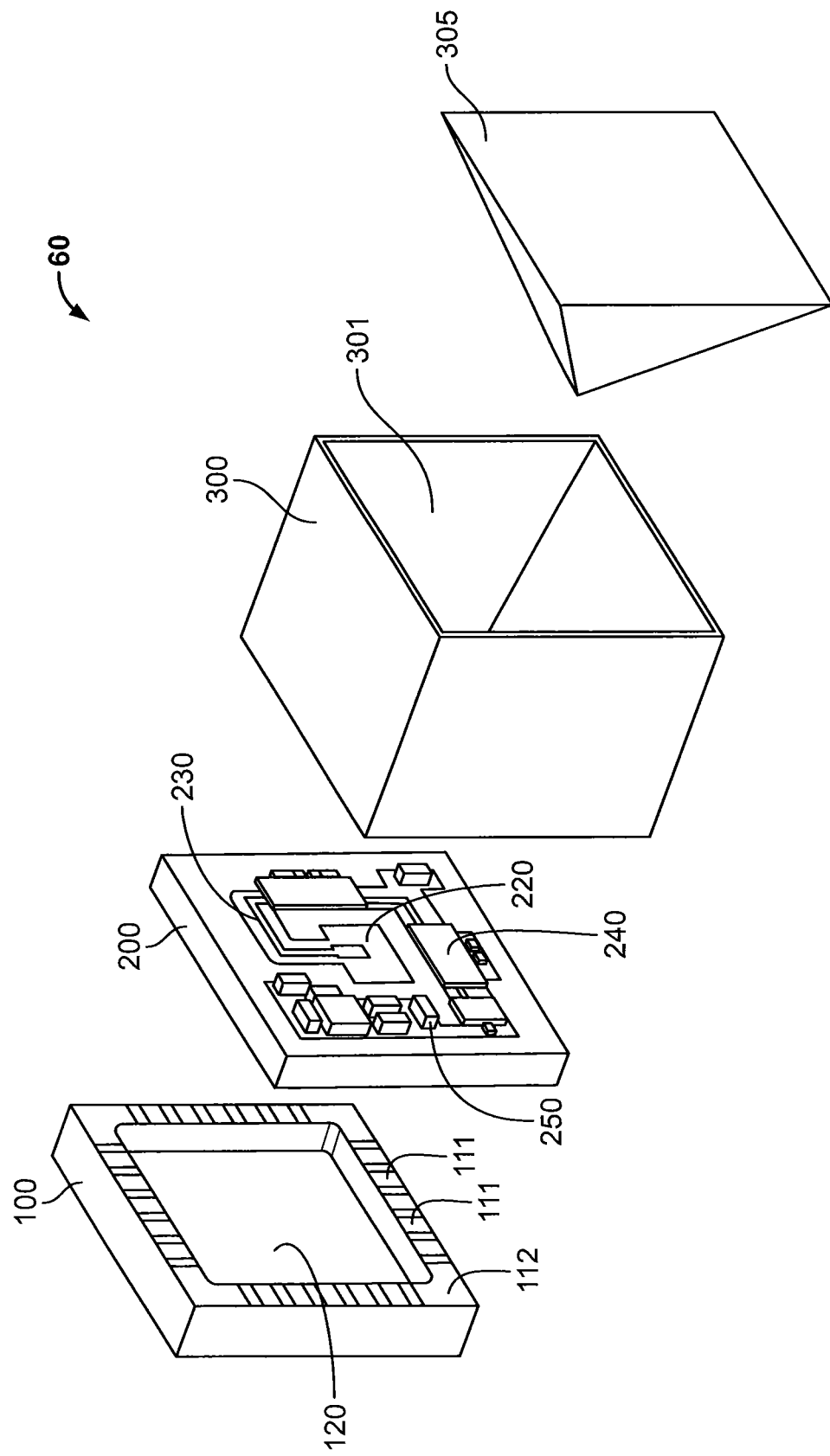
FIG. 7A is an front exploded view of the radiometer sensor cell as shown in FIG. 6A.
Figure 7B:
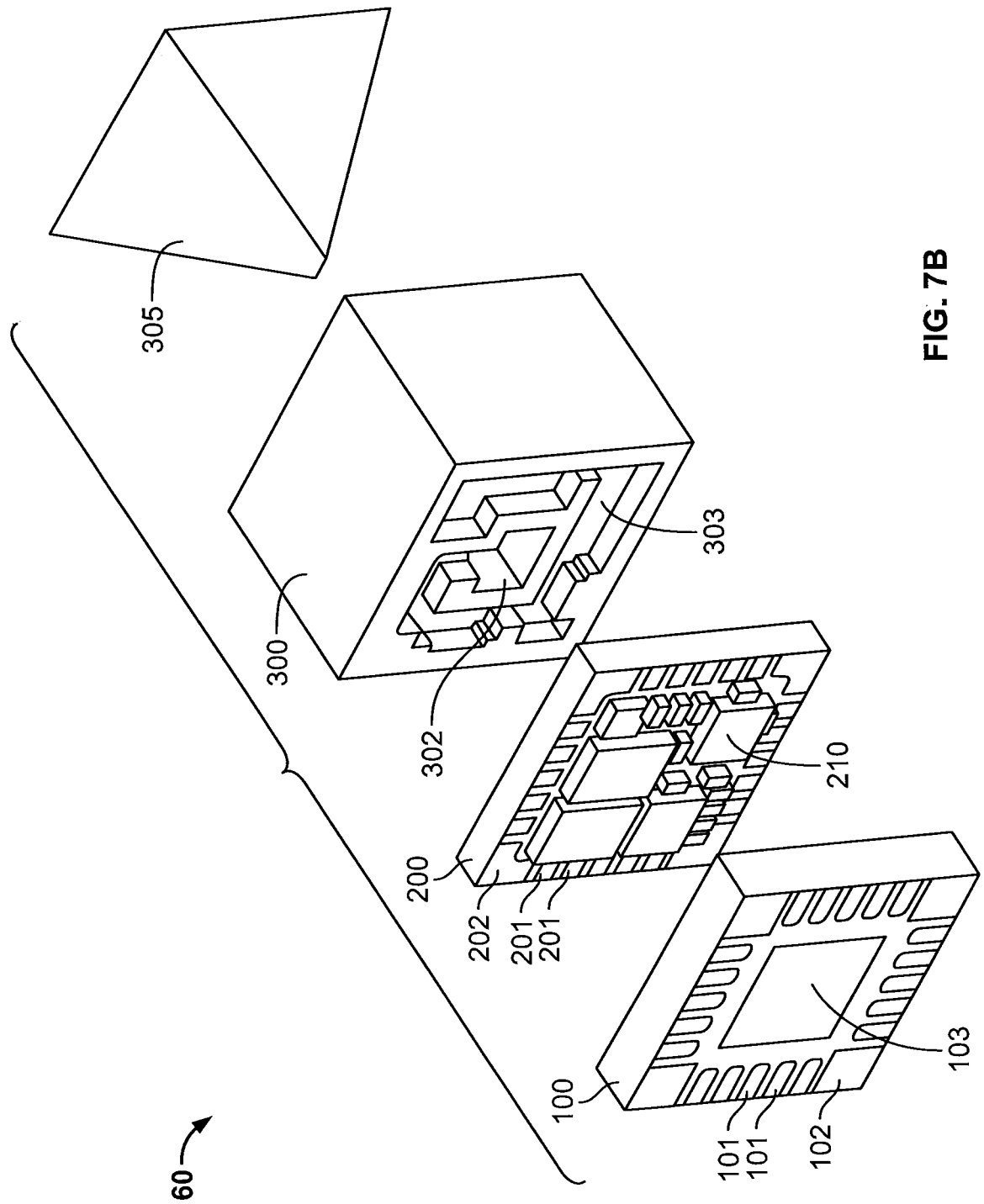
FIG. 7B is a rear exploded view of the radiometer sensor cell as shown in FIG. 6A.

FIGS. 7A and 7B show exploded views of the radiometer module 60 that can be used in accordance with one non-limiting example of the present invention. The radiometer chip 60 includes a base board 100 made of FR4 board with copper cladding on both sides, a multi-layer middle board 200 made of FR4 core with laminated soft board with copper cladding on both sides, and an injection molded metal plated cover 300 encompassing a feedhorn 301 which is filled with dielectric material 305.

The bottom and top copper clad layers of base board 100, are etched to form signal pads 101 and 111, and heat transfer pads 102 and 112. The signal pads 101 and the heat transfer pads 102 are connected to the top of the base board signal pads 111 and heat transfer pads 112 using vias (not shown). A cavity 120 is machined on the top side of the base board 100 to house the surface mount chips 210 which are mounted to the bottom of the middle board 200. The bottom of middle board 200 is attached to form signal pads 201 and heat sink pads 202. These pads align with the signal pads 111 and heat transfer pads 112 on the top surface of the base board 100. The bottom side of the middle board 200 also includes surface mount parts 210. The top side of the middle board 200 includes a micro-strip to waveguide transition 220, etched RF lines 230, bare die MMIC's 240 and surface mount parts 250.

The top cover 300, which is made of electrically conductive plastic or metal plated injection molded plastic, includes the feedhorn 301, which accepts dielectric material 305. The bottom side to the cover includes the waveguide section 302, cavities to house the MMIC's 240 surface mount chips 250 that are mounted on the top surface of the middle board 200, and to create narrow channels to improve isolation and cut-off unwanted RF energy propagation.

Figure 8B:
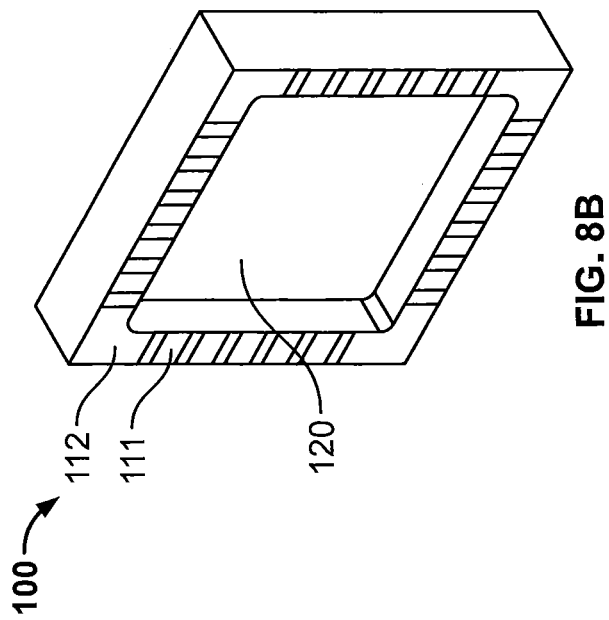
FIGS. 8A and 8B are respective front and rear perspective views of the base board of the radiometer chip of FIG. 6A.
Figure 8A:
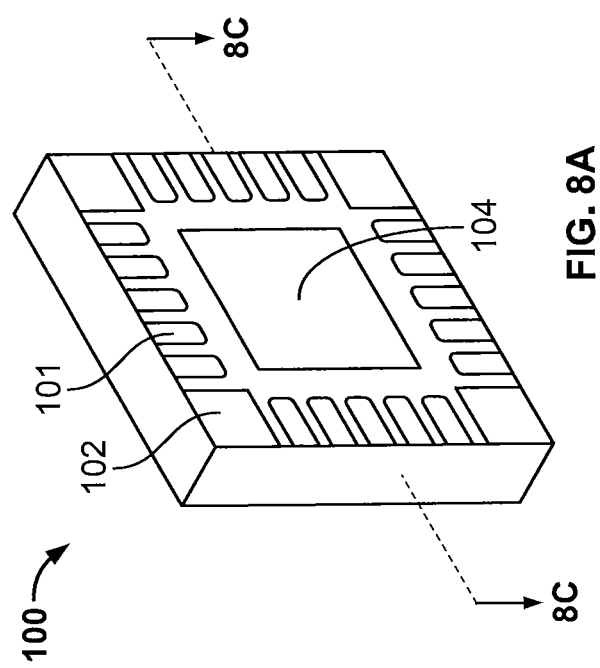
Figure 8C:
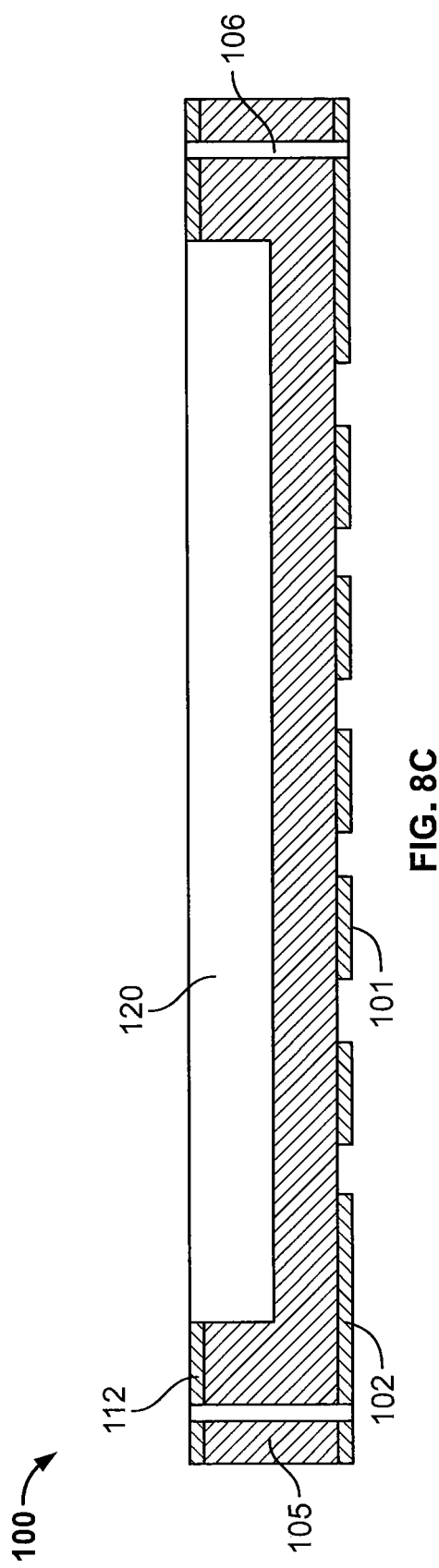
FIG. 8C is a cross-sectional view of the base board of the radiometer chip of FIG. 6A taken along lines 8C-8C.
Figure 9B:
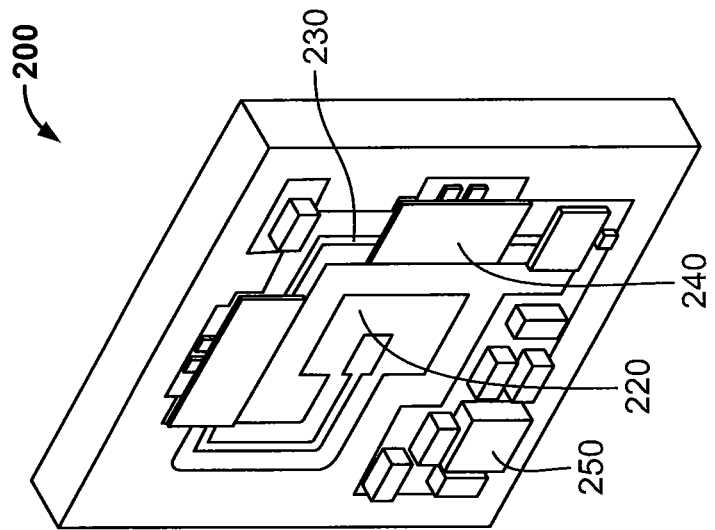
FIG. 9B is a rear perspective view of the middle board of the radiometer chip of FIG. 6A.
Figure 9A:
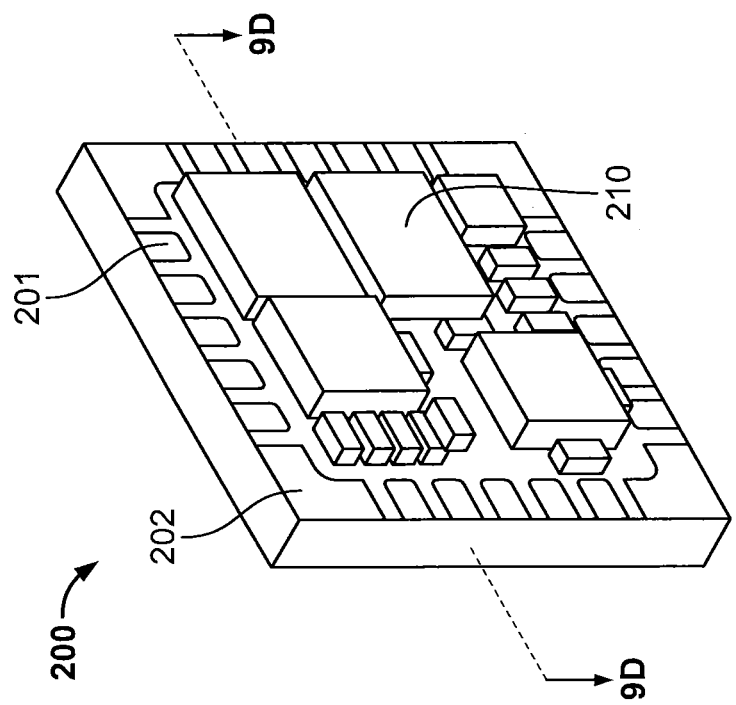
FIG. 9A is a front perspective view of the middle board of the radiometer chip of FIG. 6A.
Figures 9C, 9D:
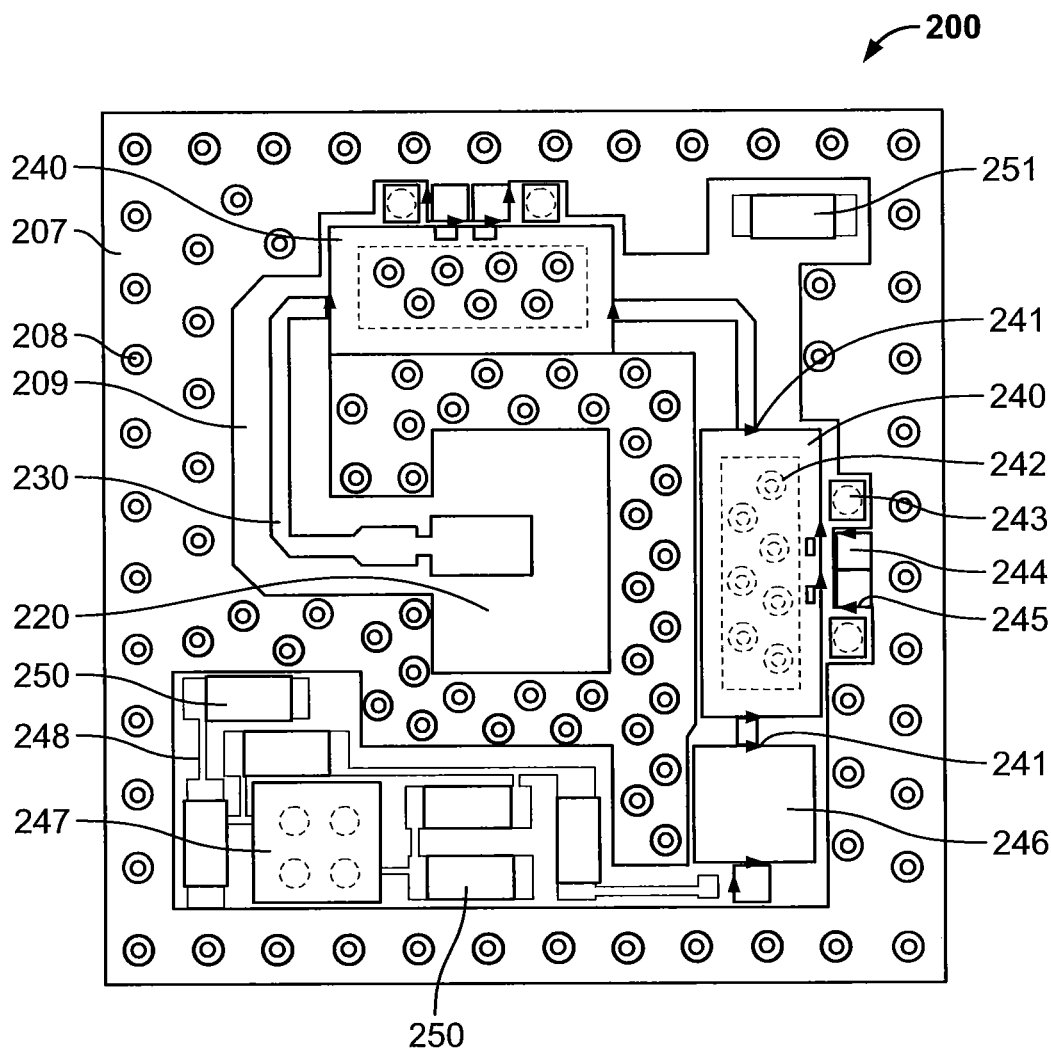
FIG. 9C is a top view of the middle board of the radiometer chip of FIG. 6A.
FIG. 9D is a cross-sectional view of the middle board of the radiometer chip of FIG. 6A taken along lines 6D-6D.

FIGS. 8A-8C show multiple views of the base board 100. In some embodiments, the base board 100 starts with a 47 mil FR4 board 105 with copper cladding on both sides. The copper is etched on both sides of the board to form signal pads 101 and 111, and heat sink pads 102 and 112 on both side. An additional grounding pad 104 is also etched on the bottom surface. The top and bottom pads are connected through vias 106. A cavity 120 approximately 0.65 mm deep is machined on the top layer to accept the surface mount parts 210 mounted at the bottom of the middle board 200.

The base board 100 can be fabricated from a large FR4 board and cut to size after fabrication. An 8.5 inch by 11-inch board can yield over 1,000 radiometer module base boards 100. The total base board 100 for each radiometer chip cost is typically less than $1 in volume at present day prices.

The base board 100 fabrication starts with a standard laminate board, such as FR-4, with 2 opposing metal clad layers. First, the vias 106 are installed in the material to connect the up and lower metal surfaces. Next the bottom layer is etched to define the signal and ground pads. The top metal layer is selectively etched to define the signal and ground pads. The last step in the fabrication process is to machine a cavity to a specific depth on the top side. This cavity area is used provide an opening for the SMT components on the bottom layer of the middle board to drop into.

FIGS. 9A-9D show multiple views of the middle board 200 for the radiometer chip 60. The bottom side of the middle board 200 includes all the signal pads 201 and all the heatsink pads 202 that are needed to interface with the base board 100. It also encompasses many surface mount parts that are used for DC voltage conditioning, LNA gate bias circuits, gain control, calibration data storage in an EPROM, and digital interface circuits such is $I^2C$. The signals are transferred from the bottom side to the top side of the board through vias 203.

The middle board 200 is made up of multiple layers 204 of soft board dielectric material, such as Duroid, laminated to a FR4 core 205. All layers have copper cladding 206 on both side. The top layer of the middle board 200 is formed by etching the copper layer 207. Ground vias 208 are used throughout the top layer to provide good grounding and improve isolation. The etched surface 209 removes the copper clad and exposes the dielectric material. The size of the etched areas channels 209 are carefully controlled by RF design guidelines to insure proper propagation of RF energy and cut off of unwanted signals. The spacing between the ground vias 208, which is typically ¼ of a wavelength of the highest frequency used in the miniature module, insures isolation between the different compartments. The microstrip-to-waveguide transition 220 and the RF transmission line 230 are created during the etching process. The 50 Ohm microstrip lines are connected to the MMIC LNA's 240 using ribbon bonds 241. Heat sink vias 242 are created under the MMIC chip 240 to carry the heat to the heat sink pads 202 through the inter copper clad layers 206. Signal vias 243 are used to carry gate and drain voltages from the bottom to the top of the middle board 200. Chip capacitors 244 are used for decoupling of the drain and gate voltages. The capacitors are connected to the signal pads through wire bonds 245. Amplified RF signal at the output of the LNA is sent to the detector diode 246. The output of the diode is filtered and sent to the video amplifier 247 using signal traces 248, which are etched on the top surface of the board. A temperature sensor 251 is mounted near the MMIC's to sense temperature, which is used for module calibration.

In this example, the multi-layer middle board 200 could have a core made out of FR4 layer 205 and the top dielectric layers 204 could be a laminated dielectric material such as Rogers 5880. As known to those skilled in the art, FR4 is a type of board used for making a printed circuit board and is an abbreviation for flame resistant 4 and formed as a composite of a resin epoxy reinforced with a woven fiberglass mat. This description typically describes the board with no copper covering and is less reactive at high frequencies and absorbs less moisture than typical synthetic resin bonded paper. FR4 board als has greater strength and stiffness than other materials. It is acceptable for signals up to and exceeding 5 GHz. Rogers 5880 board is a high frequency laminate that is formed as a glass microfiber reinforced PTFE composite that can be designed for exacting stripline and microstrip circuit applications. The glass reinforcing microfibers can be randomly oriented to maximize benefits of fiber reinforcement in the directions valuable to circuit producers. The laminates are easily cut, sheered and machined to a desired shape and are resistant to many solvents and reagents, hot or cold, normally used in etching printed circuits or in plating edges and holes. Typically, a Rogers board is formed as a laminate and has some electrode deposited copper of about one-quarter to about two ounces per square foot, which is about eight to about 70 micrometers on both sides.

The radiometer module/chip 60, in one non-limiting embodiment, does not include a bandpass filter. The function of a filter can be integrated into the low noise amplifier characteristics. For example, if the radiometer sensing bandwidth is between about 80 and 100 GHz, the LNA gain characteristics can be tailored to match this bandwidth.

There are many utility and simulation programs available in the market that allow someone to design all the high frequency RF circuits of the middle board 200, including the microstrip lines, microstrip-to-waveguide transition, and impedance matching networks. Although impedance matching networks may seem mundane, their proper design and implementation is critical to the efficient transfer of power along the signal path of an RF device. If there is an impedance mismatch, electrical signals will undergo reflections at the boundary of the impedance discontinuity, which can cause a significant power loss. Miniaturized RF modules designs such as the radiometer chip of this invention present special challenges. Three dimensional models using Electromagnetic simulators, such as HFSS sold by Ansof Corporation, are critical for high frequency module design.

The middle board 200 fabrication starts with a standard core, such as FR-4, with 2 opposing metal clad layers, then additional high frequency soft boards are laminated to the core board. Standard and blind vias are installed in the material to connect the different metal layers. Next the layers are etched to create the desired printed RF circuits and define the signal and ground pads. Next, all the SMT are assembled both sides of the board.

The middle board 200 used for each radiometer chip 60 can be fabricated from a large multi-layer board and cut to size after fabrication. An 8.5 inch by 11-inch board can yield over 1,000 radiometer module middle boards 200. The total middle bare board for each radiometer chip cost is typically less than $3 in volume at present day prices.

Figure 10C:
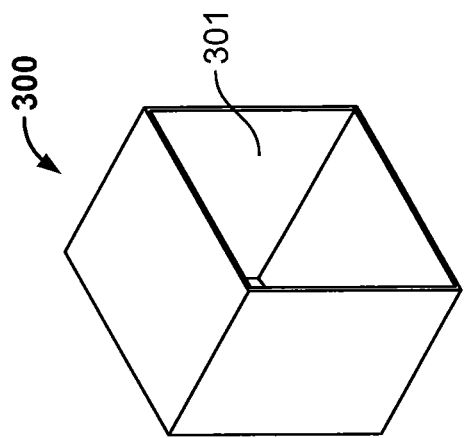
FIGS. 10B and 10C are respective front and rear perspective views of the top cover of FIG. 10A.
Figure 10B:
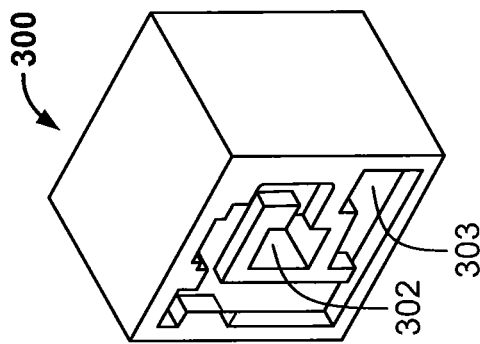
Figure 10A:
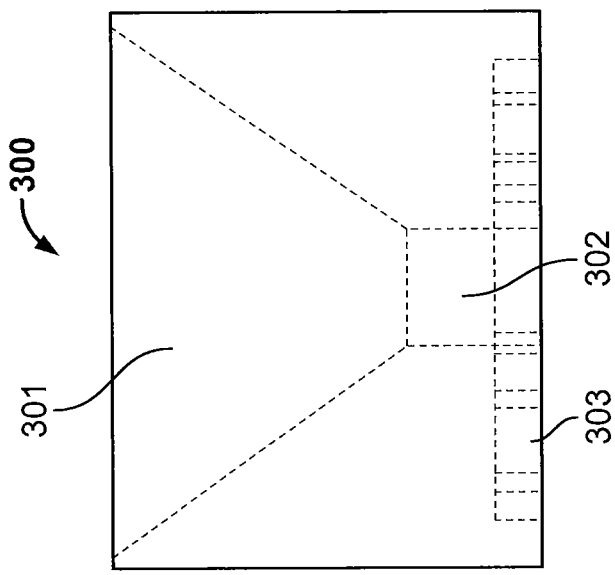
FIG. 10A is a side view of the top cover including the feedhorn of the radiometer chip of FIG. 6A.

FIGS. 10A-10C show multiple views of the injection molded plastic cover 300. It includes the feed horn 301, which has about 30 to 35 degree flare angle and is optimized to provide about 30 degree beam width. The cover 300 also includes a waveguide section 302 which makes contact with the micro-strip to waveguide 220 on the top surface of the middle board. The cover 300 also provides channelization 303 to protect the bare MMIC chips mounted on top of the middle board 200 and to provide RF isolation. The cover 300 can be made by using well-known micro-molding plastic techniques and then metal plating to create conductive surfaces in channel 303 and at the feedhorn 301. The cover 300 can be fabricated by various known methods. The feedhorn 301 is made to accept dielectric material 305 as described before. This type of material can be injection molded and easily attached to the feedhorn 301 with epoxy or other adhesives. The size and shape of the compartments and channels 303 are carefully controlled by RF design guidelines to prevent airborne propagation of RF energy and to cut off unwanted signals. A waveguide channel shape is defined by the frequency and the desired propagation modes. Metal waveguides (channels) have been commonly used in RF application to propagate the desired RF signals while preventing (cutting off) unwanted signals. The size and shape of the waveguide channel defines the operating frequency and the cut-off frequency. The current invention channelized cover 300 is not made of metal material. The channels and waveguides in the cover are created by metalizing plastic surfaces.

Although the cover 300 of the present invention is made of metalized injection molded plastic, it must still adhere to critical properties of RF module design and perform the same function as a metal housing, but with much more efficiency, less cost and smaller size than taught in the prior art.

Although RF waveguides can support many modes of transmission, the usual mode of transmission in rectangular waveguide is called TE01. The lower cutoff wavelength (and frequency) for this mode are:

$$\lambda_{lower\ cut\ off} = 2 \times a (m)$$

$$F_{lower\ cut\ off} = c/(2 \times a)(GHz)$$

Where a=dimension of the board wall (meters)
c=Speed of light (meters/second)

The upper cutoff frequency is exactly one octave above the lower. The accepted limits of operation for rectangular waveguide are (approximately) between 125% and 189% of the lower cutoff frequency.

Although waveguide channels in prior art RF modules are typically created by machining metal housings, in this invention waveguide channels are created by a metalizing plastic walls.

Figure 11A:
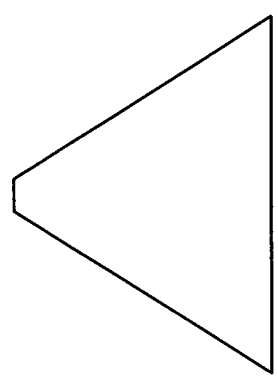
FIG. 11A is a side view of the dielectric insert for the feedhorn.
Figure 11B:
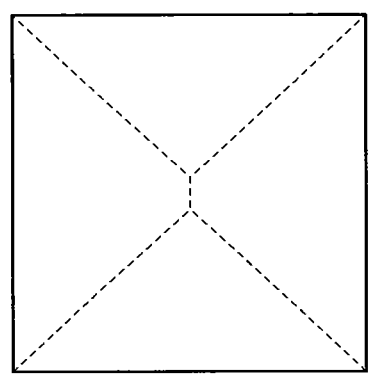
FIG. 11B is a top view of the dielectric insert for the feedhorn.
Figure 11C:
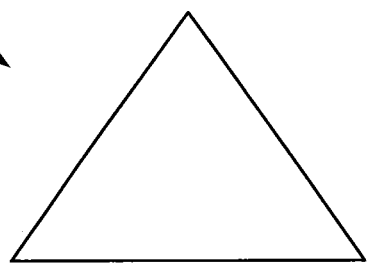
FIG. 11C is another side view of the dielectric insert for the feedhorn.

FIGS. 11A-11C show multiple views of the dielectric material insert 305 that fits inside the feedhorn 301. The insert 305 is made by injection molding of low RF loss dielectric material such as PTFE, Polypropylene, or High density Polyethylene. Whatever type of material is chosen, electromagnetic simulation is performed to properly match the design of the horn, the waveguide section and the waveguide-to-microstrip transition to the injection molded insert.

The RF energy from a target is captured by the dielectrically filled feedhorn 301. The energy is transformed from the waveguide media to a microstrip using the waveguide-to-microstrip transition 220, which is built into the middle board 200. RF signals are amplified using one or more low noise amplifiers 240. The amplified signal is detected using a square law detector diode 246.

Figure 12A:
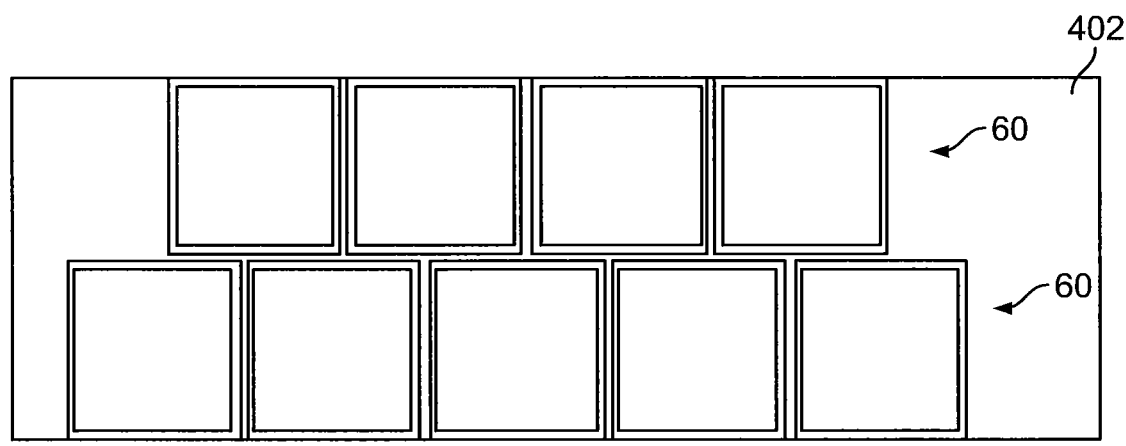
FIG. 12A is a top view showing radiometer chips of FIG. 6A mounted on a printed wiring board, in accordance with an embodiment of the present invention.
Figure 12B:
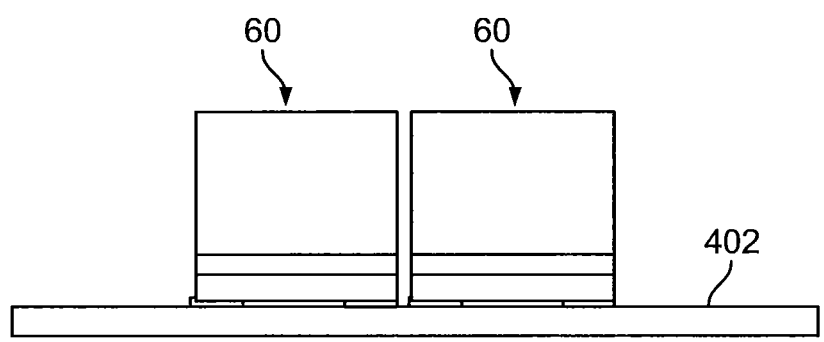
FIG. 12B is a side view of the radiometer chips and printed wiring board of FIG. 12A.

With a total width of a radiometer sensor cell at 6 mm in one non-limiting example, spacing between individual chips can be as little as 6.1 mm, which is about 1.8λ (wavelength) at 90 GHz. With a half-width offset between two rows, as shown in FIGS. 12A and 12B, cell-to-cell spacing can be reduced to about 0.9λ, which is well within the desired one λ spacing. The radiometer chips 60 can be mounted directly on an FR4 board 402 or other similar board using solder or other similar SMT techniques.

Figure 13:
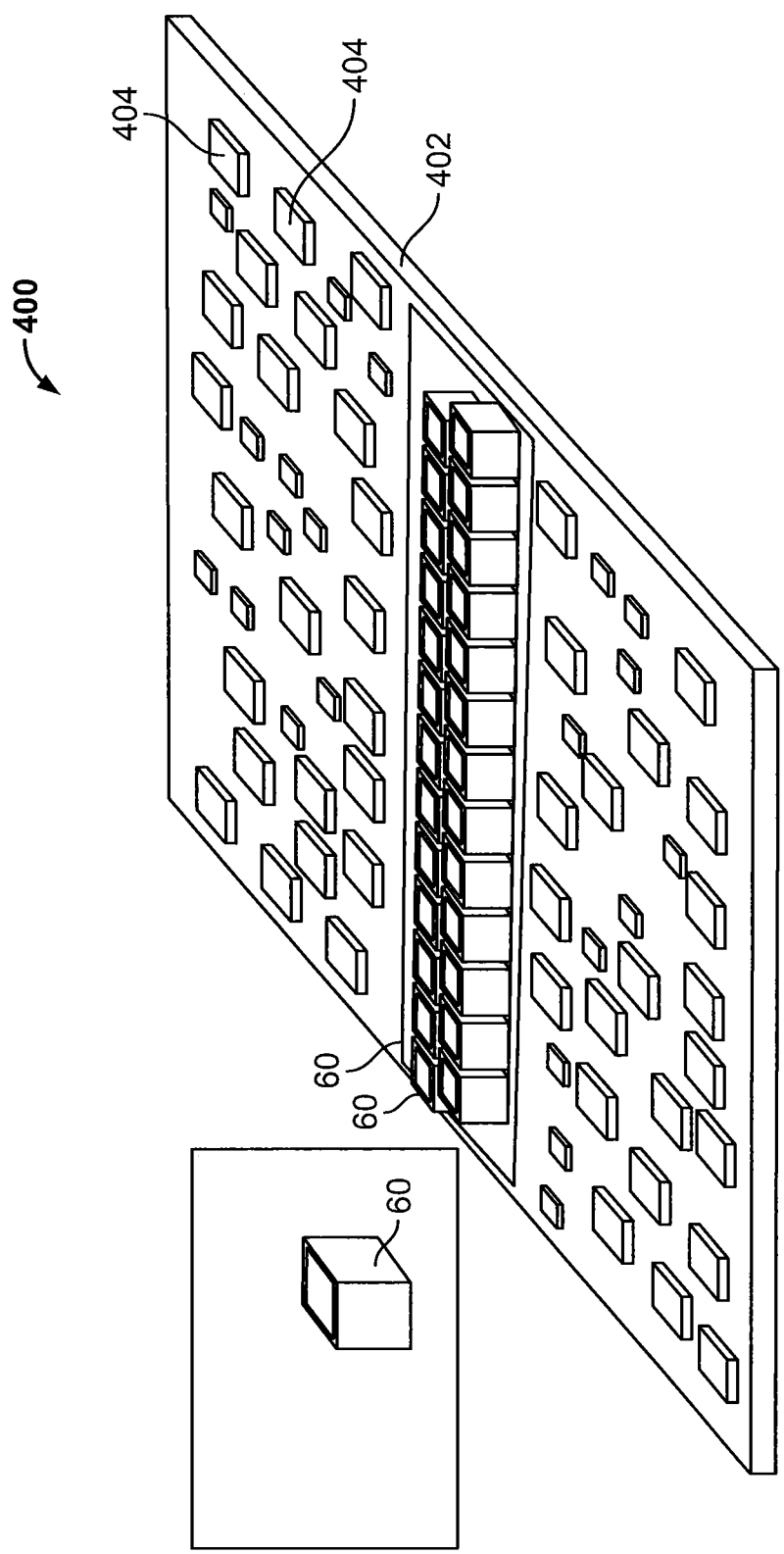
FIG. 13 is a top perspective view of a multi-channel radiometer printed wiring board and having a plurality of radiometer chips according to embodiments of the present invention mounted thereon and other surface mounted technology (SMT) components.

FIG. 13 shows a possible layout of a 26-sensor (or pixel) radiometer device illustrated generally at 400. The radiometer sensor chips 60 are mounted directly to the FR4 support board 402 along with the rest of the surface mount technology (SMT) components 404. The radiometer chip RF sensing and detection is entirely enclosed in itself, and therefore no RF isolation or channelization hardware is required. The radiometer chips 60 can be surface mounted and allow complete flexibility in how the sensors are mounted on the board. Polarization selection can be made by rotating the cells. An entire multi-channel radiometer can be constructed on a single FR4 board and no additional circuits or housing is required.

In one embodiment, an integrated miniature chip 60 measures approximately 6 mm×6 mm×6 mm and weighs <1 gram in one non-limiting example of a W-band radiometer receiver. This represents over 20:1 reductions in size and weight when compared to an equivalent current art radiometer module. The miniature module is uniquely designed to provide high performance and low cost. The exact design of the RF circuits and channelized cover are derived from the fundamental RF design rules for high frequency modules which in this instance is 80 to 100 GHz.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. A radiometer chip, comprising:
   a base board comprising opposing first and second surfaces, each surface comprising ground and signal pads, and a cavity formed in the second surface;
   a middle board comprising opposing first and second surfaces, wherein the middle board first surface is attached to the base board second surface and such that ground and signal pads on the middle board first surface are electrically connected to the ground and signal pads respectively of the base board second surface, wherein the middle board first surface comprises one or more electrical components that extend into the base board cavity, and wherein the middle board second surface comprises etched radio frequency (RF) circuits, a waveguide-to-microstrip transition, at least one low noise amplifier (LNA), a detector diode, a video amplifier, and a temperature sensor, wherein the LNA is operatively connected to the waveguide-to-microstrip transition and a detector circuit for producing a detected signal and for further amplification by the video amplifier; and
   a cover attached to the middle board second surface, the cover comprising a feed horn that is connected to the waveguide-to-microstrip transition.

2. The radiometer chip of claim 1, wherein the feed horn comprises an insert of dielectric material, wherein the insert is configured to improve feedhorn performance and seal the radiometer chip from outside air, humidity and contaminants.

3. The radiometer chip of claim 1, wherein the base board and middle board comprise FR4 material.

4. The radiometer chip of claim 1, wherein the middle board comprises multiple layers of laminated high frequency soft boards.

5. The radiometer chip of claim 1, wherein an output of the detector diode is connected to a variable gain video amplifier.

6. The radiometer chip of claim 1, wherein the temperature sensor is configured to sense a temperature of the radiometer chip.

7. The radiometer chip of claim 1, wherein the one or more electrical components on the middle board first surface provide DC signal conditioning, gate biasing of the LNA, gain control of the video amplifier, digital interfaces, and memory storage of data for the radiometer chip.

8. The radiometer chip of claim 7, wherein the memory storage stores radiometer chip calibration data comprising output voltage versus temperature, sensitivity slope, and serial number.

9. The radiometer chip of claim 1, wherein the cover comprises metalized injection molded plastic.

10. The radiometer chip of claim 1, wherein the cover further comprises a waveguide section, and compartments for isolating RF circuits of the middle board.

11. The radiometer chip of claim 1, wherein the base board and middle boards are attached together via adhesive or solder, and wherein the middle board and cover are attached together via adhesive or solder.

12. A radiometer chip, comprising:
   a base board comprising opposing first and second surfaces, each surface comprising ground and signal pads, and a cavity formed in the second surface;
   a middle board comprising opposing first and second surfaces, wherein the middle board first surface is attached to the base board second surface and such that ground and signal pads on the middle board first surface are electrically connected to the ground and signal pads respectively of the base board second surface, wherein the middle board first surface comprises one or more electrical components that extend into the base board cavity, and wherein the middle board second surface comprises etched radio frequency (RF) circuits, a waveguide-to-microstrip transition, at least one low noise amplifier (LNA), a detector diode, a video amplifier, and a temperature sensor, wherein the LNA is operatively connected to the waveguide-to-microstrip transition and a detector circuit for producing a detected signal and for further amplification by the video amplifier; and a cover attached to the middle board second surface, the cover comprising a feed horn that is connected to the waveguide-to-microstrip transition, wherein the feed horn comprises an insert of dielectric material, wherein the insert is configured to improve feedhorn performance and seal the radiometer chip from outside air, humidity and contaminants, and wherein the cover further comprises a waveguide section, and compartments for isolating the RF circuits of the middle board.

13. The radiometer chip of claim 12, wherein the base board and middle board comprise FR4 material, and wherein the cover comprises metalized injection molded plastic.

14. The radiometer chip of claim 12, wherein the one or more electrical components on the middle board first surface provide DC signal conditioning, gate biasing of the LNA, gain control of the video amplifier, digital interfaces, and memory storage of data for the radiometer chip.

15. The radiometer chip of claim 12, wherein the base board and middle boards are attached together via adhesive or solder, and wherein the middle board and cover are attached together via adhesive or solder.

16. A radiometer sensor assembly, comprising:
a support board; and
a plurality of radiometer chips surface mounted on the support board in a predetermined configuration and interconnected together, each radiometer chip comprising:
a base board comprising opposing first and second surfaces, each surface comprising ground and signal pads, and a cavity formed in the second surface;
a middle board comprising opposing first and second surfaces, wherein the middle board first surface is attached to the base board second surface and such that ground and signal pads on the middle board first surface are electrically connected to the ground and signal pads respectively of the base board second surface, and wherein the middle board first surface comprises one or more electrical components that extend into the base board cavity; and
a top cover attached to the middle board second surface.

17. The radiometer sensor assembly of claim 16, wherein the radiometer chips are oriented on the support board for a desired polarization.

18. The radiometer sensor assembly of claim 16, wherein the support board comprises a printed wiring board.

19. The radiometer sensor assembly of claim 16, wherein the radiometer chips are separated by less than 1 wavelength.

20. The radiometer sensor assembly of claim 16, wherein the radiometer chips do not require any isolation or metal housing.

* * * * *